United States Patent [19]

Houston

[11] Patent Number: 4,899,315
[45] Date of Patent: Feb. 6, 1990

[54] LOW-POWER, NOISE-RESISTANT READ-ONLY MEMORY

[75] Inventor: Theodore W. Houston, Richardson, Tex.

[73] Assignee: Texas Instruments Incorporated, Dallas, Tex.

[21] Appl. No.: 270,168

[22] Filed: Nov. 14, 1988

Related U.S. Application Data

[63] Continuation of Ser. No. 43,381, Apr. 28, 1987, Pat. No. 4,811,301.

[51] Int. Cl.⁴ .............................................. G11C 8/00
[52] U.S. Cl. ............................... 365/230.06; 307/449
[58] Field of Search ........... 365/230, 189, 233, 230.06; 307/449

[56] References Cited

U.S. PATENT DOCUMENTS 3,895,360  7/1975  Cricchi et al. ................... 365/230
3,971,001  7/1976  Lodi ................................ 365/230

Primary Examiner—Joseph A. Popek
Attorney, Agent, or Firm—Rodney M. Anderson; James T. Comfort; Melvin Sharp

[57] ABSTRACT

A low-power, noise-resistant, read-only memory (10) is comprised of a plurality of array sections (14), each section (14) having a plurality of cell locations (70-86) arranged in rows (98) and columns (88-96). Each column (88-96) is provided with a virtual ground line (107-114). Bit lines (116-126) are shared between columns (88-96). In operation, the bit lines (116-126) and virtual ground lines (107-114) are pulled up to a high voltage state. Then, one selected virtual ground line (107-114) in each section (14) is pulled low to address a pair of cell locations (70, 72) in that section (14). No active pullup means are employed. The transmission of false data through a sneak path (550) is prevented by the actuation of disconnect circuitry (38) after allowing all valid data to be sensed.

2 Claims, 6 Drawing Sheets

LOW-POWER, NOISE-RESISTANT READ-ONLY MEMORY

This is a continuation of application Ser. No. 043,381, filed Apr. 28, 1987, now U.S. Pat. No. 4,811,301.

TECHNICAL BACKGROUND

The present invention relates in general to read-only memories, and relates more particularly to on-chip read-only memories for use in electrically noisy environments.

BACKGROUND OF THE INVENTION

The development of read-only memory (ROM) technology has in the past been driven by the particular requirements for large, stand alone ROMs. More recently, ROMs have been developed for siting on-chip with a microprocessor and other circuitry. At least one recent one-chip intelligent microprocessor, the LISP chip manufactured by Texas Instruments, specifies an on-chip read-only memory with the following requirements: (a) operate according to a clock that may vary from as fast as 25 nanoseconds to very slow; (b) approach zero power consumption under a slow clock; (c) have an access time as fast as 14 nanoseconds as using the 25 nanosecond clock; and (d) allow a second metal data path bus to pass directly over the ROM.

The zero power requirement was established to allow the use of power measurement as a diagnostic tool for the testing of CMOS circuitry, the preferred type of circuitry in which the ROM is embodied. Further, the above specifications require the ROM to be insensitive to the possible noise from capacitive coupling with the overhead data path bus while meeting the stated speed and power requirements. The noise immunity requirement is met by having a sensing circuit that does not respond to less than a full logic swing on the respective bit line. However, since the establishment of a large voltage on the bit line consumes a large fraction of the allowed access time, there must be a minimum delay in the other ROM circuitry.

A need has therefore arisen in the industry for a low-power, noise-resistant read-only memory that has fast operation, and can operate under various clocks with good data integrity.

SUMMARY OF THE INVENTION

One aspect of the invention comprises a memory array having a plurality of array sections. Each array section comprises a plurality of memory cells arranged in columns. Each column has at least one bit line and a virtual ground line. An addresser is operable to address at least one cell in each column. The cell is programmable to couple a virtual ground line in a respective column with a bit line. The array further comprises column address circuitry that is operable to address a selected one of the columns in each section by discharging a virtual ground line of the selected column in that section. Sensing circuitry is provided for sensing the voltage level of at least one bit line in each selected column, the sensing circuitry outputting data on array outputs responsive to the sensed bit line voltage levels. The array further has disconnect circuitry for disconnecting the outputs from the bit lines of the addressed columns responsive to sensing a voltage level of a predetermined state on at least one of the bit lines. The disconnect circuitry provides an advantage in that under a slow clock, zero static power consumption for the array can be approached. A further advantage is that the disconnect circuitry is operated such that the critical timing path for accessing and reading out the selected cells is not affected.

Another aspect of the invention comprises a method for reading an array of memory cells. Data in the array is stored by forming a transistor in selected cells. In each column of cells, the transistor current paths are connected between a virtual ground line of the column, and a bit line adjacent to the respective transistor. Next, a row of cells is addressed by making the transistor current paths in the row conductive. Thereafter, the bit lines and the virtual ground lines are precharged to a predetermined voltage. The bit lines and virtual ground lines are then allowed to float. A selected column of cells is addressed by discharging the virtual ground line of the column to a reference voltage. Then, the state of the addressed cell in the addressed column is determined by sensing the voltage on the bit line adjacent to the addressed cell.

Allowing the bit lines and virtual ground lines to float provides an advantage in that there are no static pullups on either the bit lines or the virtual ground lines. This allows a faster development of the signal on the selected bit line.

In another advantageous aspect of the invention, a sneak path creating false output is avoided by providing a "window" during which only valid data may be sensed. As will be explained in more detail below, a sneak path is possible only where a series of adjacent bit lines each are sensed to have low states. This fact is used in actuating disconnect circuitry that disconnects the addressed bit lines from an output bus of the array. A control signal is generated responsive to a voltage signal of a predetermined state appearing on at least one bit line. This control signal in turn actuates circuitry to disconnect the bit lines of each array section from an output bus. Preferably, the control signal is delayed by a predetermined period in which all possible valid data have been read. The bit lines are disconnected only after this period has elapsed.

According to another aspect of the invention, the output bus may be disconnected by the delayed control signal in the case of a slow clock, or may be disconnected by an "address valid" or enabling/disabling signal in the case of a fast clock. The use of the address valid signal provides an advantage in that in the case of a fast clock, the output bus is disconnected in time to initiate the next cycle. This in turn provides an advantage in that the read-only memory of the invention is usable both for slow and fast clocks.

BRIEF DESCRIPTION OF THE DRAWINGS

These and further aspects of the invention and their advantages will become apparent from the following Detailed Description taken in conjunction with the appended drawings, in which.

DETAILED DESCRIPTION

Figure 1:
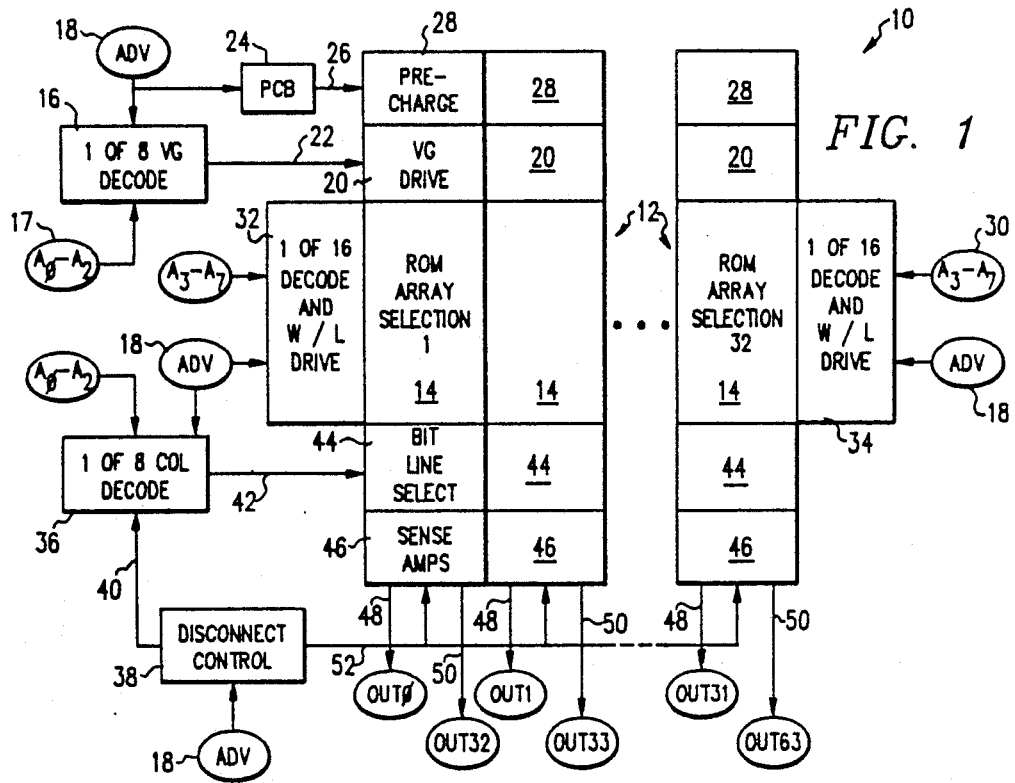
FIG. 1 is a schematic block diagram of a read-only memory according to the invention.

Referring first to FIG. 1, a functional block diagram of one embodiment of the read-only memory array according to the invention is shown. A read-only memory is indicated generally at 10. Memory 10 comprises an array of memory cells indicated generally at 12. Array 12 is divided into a plurality of array sections 14. Each array section 14 has a plurality of cell locations arranged in rows and columns, as will be more particularly described below. In one embodiment, array 12 comprises 32 array sections 14. Memory 10 in this embodiment can store 256 words of 64 bits each. The memory words are arranged in the preferred embodiment in an array of 32 rows, each row containing eight interleaved words.

As will be detailed below, each array section 14 contains the data for a lower order (0-31) bit and an upper order (32-63) bit. Each array section 14 is further divided into eight columns, and as will be shown in more detail below, each column has a virtual ground line, and in most instances, shares two bit lines with adjacent columns.

A one-of-eight virtual ground decoder 16 is provided to select one virtual ground line of the eight inside each column 14. This decoding is done in response to receiving the first three bits ($A_0$–$A_2$) of an address received by the memory. Decoder 16 is enabled to decode the virtual ground address from bits $A_0$–$A_2$ in response to an enabling/disabling or "address valid" (ADV) signal 18. The ADV signal 18 is somewhat analogous to a chip select signal for a stand alone ROM. A virtual ground drive section 20 is disposed adjacent each array section 14. An 8-bit address bus 22 connects virtual ground decoder 16 with each of the virtual ground drive sections 20.

ADV signal 18 is further used as an input to a precharge signal generator 24. A precharge signal PCB is transmitted via a line 26 to each of a plurality of precharge sections 28 located adjacent virtual ground drive sections 20.

Input address bits $A_3$–$A_7$ (30) are used to select one of the 32 rows in the array. Sixteen of the 32 rows are selected by a row decoder and word line driver section 32 on the left side of the array, and the other sixteen are decoded by decoder and word line driver 34 on the right side of the array. Decoder and word line drivers 32 and 34 are enabled by the ADV signal 18. The first three address bits $A_0$–$A_2$ are further used to decode a one-of-eight column address by a column decoder 36. Column decoder 36 is enabled by ADV signal 18. Column decoder 36 further receives a disconnect signal from a disconnect control section 38 via a control on each section 14 line 40. Column decoder 36 selects a decoded column in each section 14 via a bus 42, which is connected to each of a plurality of bit line select sections 44. One bit line select section 44 is provided for, and is adjacent to, each ROM array section 14. ADV signal 18 is further used as an input to disconnect control section 38.

A sense amplifier section 46 is provided for each array section 14. Each sense amplifier section 46 senses the state of two addressed memory cells disposed in a respective section 14. Those states are output on a respective lower order bit output line 48 and an upper order bit output line 50. Each sense amplifier 46 also generates a disconnect control signal on line 52 responsive to receiving a low state from an addressed cell in a respective section 14, as will be described in more detail below.

The stored data is arranged according to a preferred architecture of array 10 as follows. A first array section 14 stores, for each of eight words in each of 32 rows, a "0" bit and a "32" bit. These are output at OUT0 and OUT32, respectively. The second array section 14 stores data for a "1" bit and a "33" bit, and these bits for a selected word are output at OUT1 and OUT33, respectively. Finally the thirty-second array section 14 stores a "31" lower order bit and a "63" upper order bit for each of eight words in each of 32 rows, which are output at OUT31 and OUT63.

Figure 2:
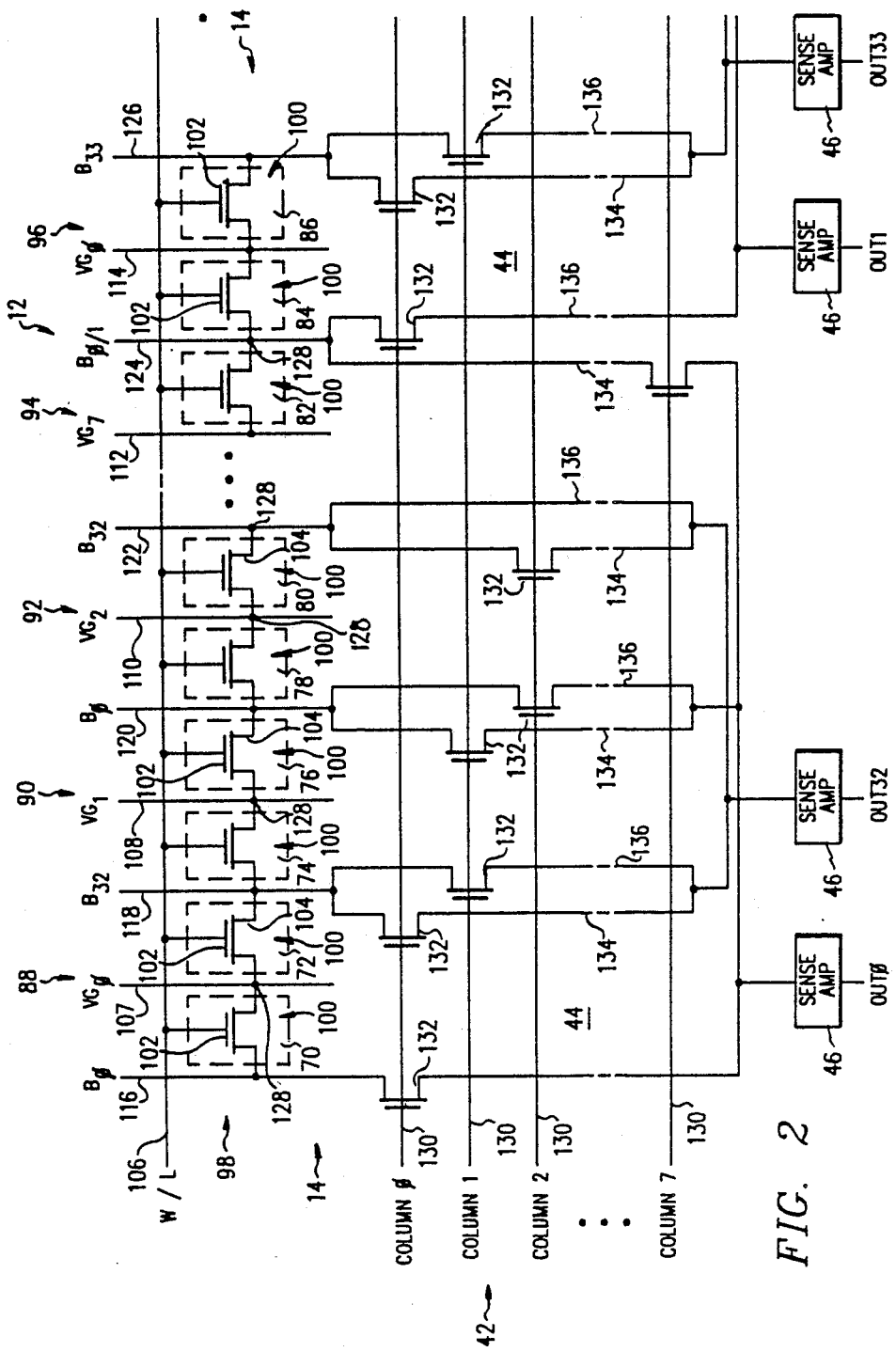
FIG. 2 is a schematic electrical diagram showing a preferred read-only memory array structure.

Turning now to FIG. 2, the electrical structure of array 12 is more particularly illustrated. FIG. 2 illustrates portions of two sections each indicated generally at 14. Each array section 14 has a plurality of cells indicated at 70–86, that are arranged in a plurality of columns 88–96 and rows 98. Each section 14 preferably has eight columns, although only three columns 88–92 are shown for a first array section 14, and only two columns 94 and 96 are shown for the second array section 14. Further, only one row 98 is shown, it being understood that each array section 14 preferably has 32 such rows.

In each cell 70–86, a transistor 100 may be formed. The presence of a transistor 100 in any of cells 70–86 encodes a bit having one binary state for that cell, and the absence of a transistor 100 in any of cells 70–86 encodes a bit having an opposite binary state for that cell.

Where formed, each transistor 100 will have a gate 102 that controls the conductivity of a current path 104. Each gate 102 in any one row 98 is connected to a word line 106 for the row. One side of each current path 104 in the row is connected to a respective virtual ground line 107–114, and the other side to a bit line 116–126. In each section, bit lines 116–126 are formed alternately or in an interdigitated manner with virtual ground lines 107–114, and preferably run parallel to each other. One virtual ground line 107–114 is provided for each respective column 88–96. Each virtual ground line 107–114 may be connected to either or both of two adjacent bit lines 116–118, 118–120...124–126 by transistors formed between the respective virtual ground line and the adjacent bit line. Except for the first bit line 116 and a last bit line (not shown), each bit line is shared by two virtual ground lines.

It is preferred that cell locations 70–86 be programmed at the moat level, i.e. the decision as to whether transistors 100 should be formed in respective cell locations 70–86 should be made at the moat diffusion step. Further, each of four potential transistors should be connected to one node 128 through a single contact to a respective virtual ground line 107–114. For each virtual ground line, two such transistors 100 are shown. Two further transistors, however, have current paths connected to each node 128, such that the four transistors formed an "X" pattern. If the programming calls for the absence of all four transistors connected to any one node 128, then the contact is also removed. This approach has the advantages that no process modification is introduced for programming the on-chip ROM 10, and also that the reduced transistor density results in higher yield. Further, there will be a reduced capacitance on those word lines where one or more contacts are omitted and further on certain bit or virtual ground lines.

FIG. 2 further shows portions of bit line select sections 44, one of which is provided for each array section 14. An 8-bit column address bus 42 comprises eight different address lines 130, each address bus selecting a column line in each of the eight sections 14. A plurality of decoding transistors 132 are formed at selected intersections of column address lines 130 and bit lines 116–126. Within each bit line select section 44, respective bit lines 118, 120, 124 and 126 each branch into a pair of bit line portions 134 and 136. No branch is made for first bit line 116, and likewise, no branch is made for the last bit line of the last array section (Bit line 63 of array section 32, not shown). Bit line select sections 44 operate to select pairs of bit lines in each array section 14. Thus, if column 0 in each section is selected by an address line 130, bit lines 116 and 118 will be selected in the first array section 14, bit lines 124 and 126 will be selected in the second array section, and so on. In this manner, two cells having the same address will be selected for each array section 14.

Preferably, adjacent pairs of cell locations represent corresponding bits of different words. Thus, cell locations 70 and 72 represent the first and thirty-third bits of a word, while cell locations 74 and 76 represent the thirty-third and first bits, respectively, of a second word. Bit lines 116, 118 and 124, as well as bit lines between bit line 122 and 124 (not shown), are connected in parallel to a first sense amplifier 46, which outputs a lower order "OUT0" bit. Likewise, bit lines 118, 122, etc., in the first section are connected in parallel to a second sense amplifier 46 that outputs a higher order "OUT32" bit. Two sense amplifiers, one for a lower order bit and one for a higher order bit, are provided for each array section 14.

The operation of array 12 will now be briefly described as an aid to the understanding of the circuitry described in FIGS. 3–11 below. A detailed operation of array 12 as incorporated into memory 10 will be described in conjunction with FIGS. 12a and 12b. First, bit lines 116–126 and virtual ground lines 106–114 are precharged high. They are then allowed to float. One virtual ground line for each section, for example, virtual ground line 108 (VG$_1$), is selected by being pulled low. The adjacent bit lines 118 and 120 will be pulled low if transistors 100 exist in respective cell locations 74 and 76, assuming that word line 106 has been addressed. If a transistor 100 does not exist in cell 74, then bit line 118 will remain high. Likewise, if no transistor exists in cell 76, bit line 120 will remain high. The high or low state of bit line 118 is sensed by the upper-order-bit sense amplifier 46, and a corresponding output is output at OUT32. Likewise, the high or low state of bit line 20 is sensed by the lower-order-bit sense amplifier 46, and a respective output bit is output at OUT0.

In a more conventional architecture, the unselected virtual ground lines are held high, rather than allowed to float, and the possible path through an intervening bit line from the selected virtual ground to an unselected virtual ground will dissipate static power. Also, the requirement to sink the current of the unselected virtual grounds will slow the pulldown of the addressed bit line. Thus, having the unselected virtual ground lines float, provides the technical advantages of eliminating the static power associated with conventional ROMs and allowing a faster attainment of a full logic swing on the bit line. This is particularly important for a ROM located on-chip with an associated microprocessor and underneath a data path thereof, where large noise immunity is required.

The absence of active pullups on either the bit lines 116–126 or the unselected virtual grounds 107–114 during the sense operation allows the possibility of a sneak path delivering false data to an addressed bit line. For example, if ROM cell 84 does not have a transistor, bit line 124 should remain high when virtual ground line 114 is selected by being pulled low. However, bit line 124 will eventually be pulled low through the intervening bit lines 118, 120, 122... and virtual ground lines 108, 110, 112... if transistors 100 are present in each of cell locations 72–80... 82. This is because virtual ground line 106 (VG$_0$) is pulled low at the same time that virtual ground line 114 (VG$_0$) is pulled low. The sneak path conducts between adjacent sections because adjacent columns in each section 14 share a bit line, and adjacent sections 14 also share a bit line. Bit line (B$_{0/1}$) 124 is one of the bit lines shared by adjacent sections, as indicated by its double notation. A conventional way to block the sneak path is to replace the single (B$_{0/1}$) line 124 with two separate lines, thus obtaining an electrical separation between addressed virtual ground lines. This, however, undesirably increases the pitch of the ROM.

A technical advantage of the invention is its novel blocking of potential sneak paths with disconnect circuitry, as will be described in more detail below. Because of the relatively small drive capability of transistors 100 and the large capacitance of the bit and virtual ground lines 106–126, it will take a relatively long time for a sneak path to cause a false data output. In worst case conditions in the illustrated embodiment, the fastest sneak output is much slower than the slowest valid output. For instance, in one tested embodiment, the fastest valid output is five nanoseconds, the slowest is 14 nanoseconds, and the fastest possible sneak output is 60 nanoseconds. This provides a time window for latching the correct output and blocking the sneak path to output.

Figure 3:
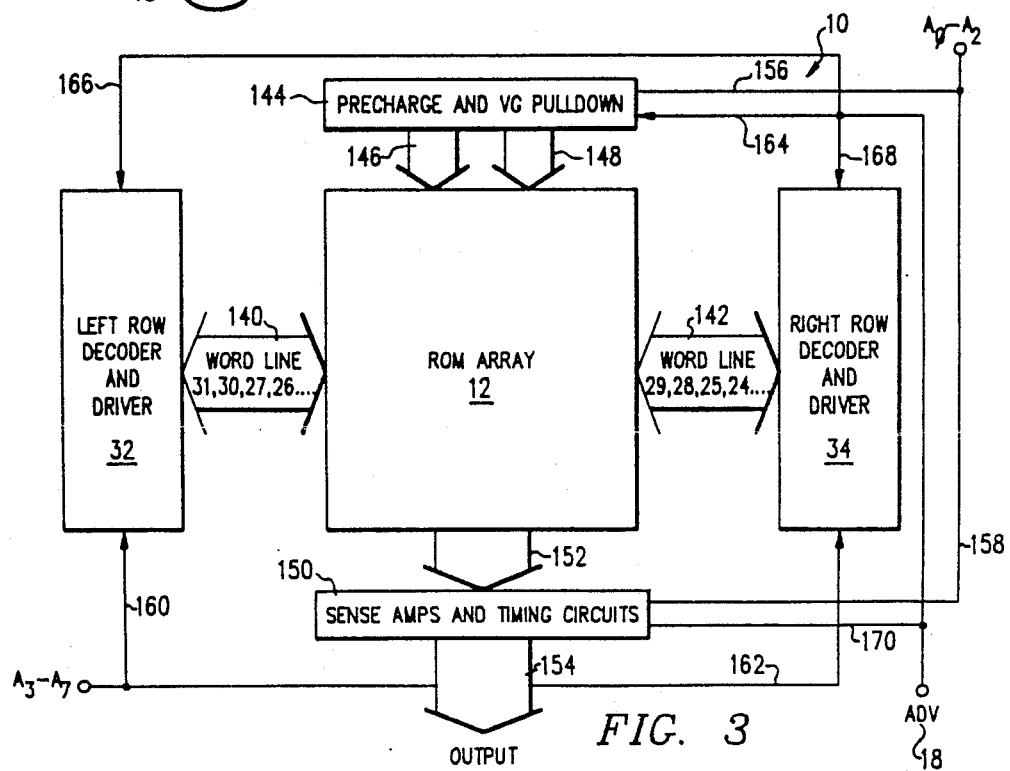
FIG. 3 is a schematic functional block diagram of a read-only memory according to the invention.

Turning now to FIG. 3, the physical organization of one embodiment of the invention is shown. The read-only memory is indicated generally at 10. A read-only memory array 12 is centrally located within memory area 10. A left row decoder and driver 32 is disposed on the left side of array 12, and is connected to array 12 by a word line bus 140. Likewise, a right row decoder and driver 34 is disposed on the right side of array 12, and is connected to array 12 by a word line bus 142. The left row decoder and driver 32 and the right row decoder and driver 34 are operable to select alternate pairs of row lines. Thus, left row decoder and driver 32 select word lines 31, 30, 27, 26, 23, 22... 3,2 while right row decoder and driver 34 selects alternating word line pairs 29, 28, 25, 24, 21, 20... 1,0. A precharge and virtual ground pulldown section 144 is disposed at the top of array 12, and is connected thereto through a 255-line virtual ground bus 146, and a 256-line bit line bus 148. A sense amplifier and timing circuit section 150 is disposed on the bottom of array 12. Sense amplifier and timing circuit section 150 is connected to array 12 via a 256-line bit line bus 152. Section 150 produces a 64-line external output bus 154, comprising outputs OUT-0–OUT63 (FIG. 1).

The external inputs to array 10 are as follows, in addition to various power supplies (not shown). An address is input into the array that in the illustrated embodiment has eight bits. The first three address bits $A_0$–$A_2$ are input via a 3-conductor line 156 to precharge and virtual ground pulldown section 144, and by a similar line 158 to sense amplifier and timing circuit section 150. Address bits $A_0$–$A_2$ are used to decode the columns. The remaining five bits of the address $A_3$–$A_7$ are used in decoding the rows. Address bits $A_3$–$A_7$ are input by a five-conductor line 160 to left row decoder and drive 32, and by a similar line 162 to right row decoder and driver 34. "Address valid" or enabling signal input ADV (18), corresponding to a "chip enable" input on a stand-alone ROM, is input via a line 164 to precharge and virtual ground pulldown section 144; via a line 166 to left row decoder and driver 32; via a line 168 to right row decoder and driver 34; and via a line 170 to sense amplifier and timing circuit section 150. ADV signal 18 is required to enable the operation of each of peripheral circuit sections 32, 34, 144 and 150. In place of left row decoder and driver 32, and right row decoder and driver 34, the word lines could also be driven from only one or the other of the two sides, or alternatively could be driven from the center.

Figure 4:
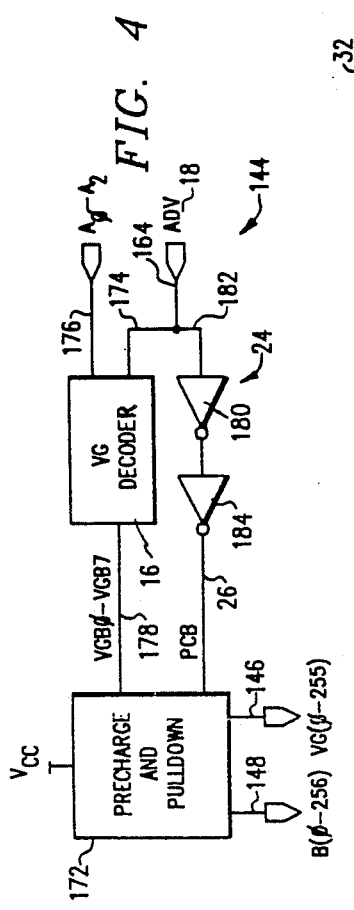
FIG. 4 is a schematic electrical block diagram of the precharge and virtual ground pull down circuitry shown in FIG. 3.

Referring next to FIG. 4, the precharge and virtual ground pulldown section 144 of FIG. 3 is shown in more detail. Section 144 is composed of two principal subsections: a precharge and pulldown section 172, and a virtual ground decoder section 16. ADV signal 18 is fed via lines 164 and 176 to virtual ground decoder 16. Address bits $A_0$–$A_2$ are fed via a bus 176 to decoder 16. Decoder 16 is enabled by a high state of ADV signal 18. It acts to select one of eight virtual ground lines based on the values of address bits $A_0$–$A_2$ input on bus 176. The decoded virtual ground line address is output on an 8-bit bus 178 to precharge and pulldown section 172. ADV signal 18 is further fed via lines 164 and 182 to a first inverter 180. Inverter 180 acts to invert ADV signal 18 and delay it, and communicates the delayed, inverted ADV signal to a second inverter stage 184. Inverter stages 180 and 184 together comprise the precharge signal generator 24 shown in FIG. 1. Generator 24 puts out a precharge signal PCB on output line 26, which is fed into precharge and pulldown section 172.

Section 172 has two functions. First, responsive to a PCB signal on line 26, it will precharge each bit line and each virtual ground line in array 12. The precharge action is effected through bit line bus 148 and virtual ground line bus 146. Second, section 172 will discharge pulldown each eighth virtual ground line, one in each section, depending on the address of the selected virtual ground line as communicated to it via bus 178. The virtual ground lines selected are pulled down via virtual ground line bus 146.

Figure 5:
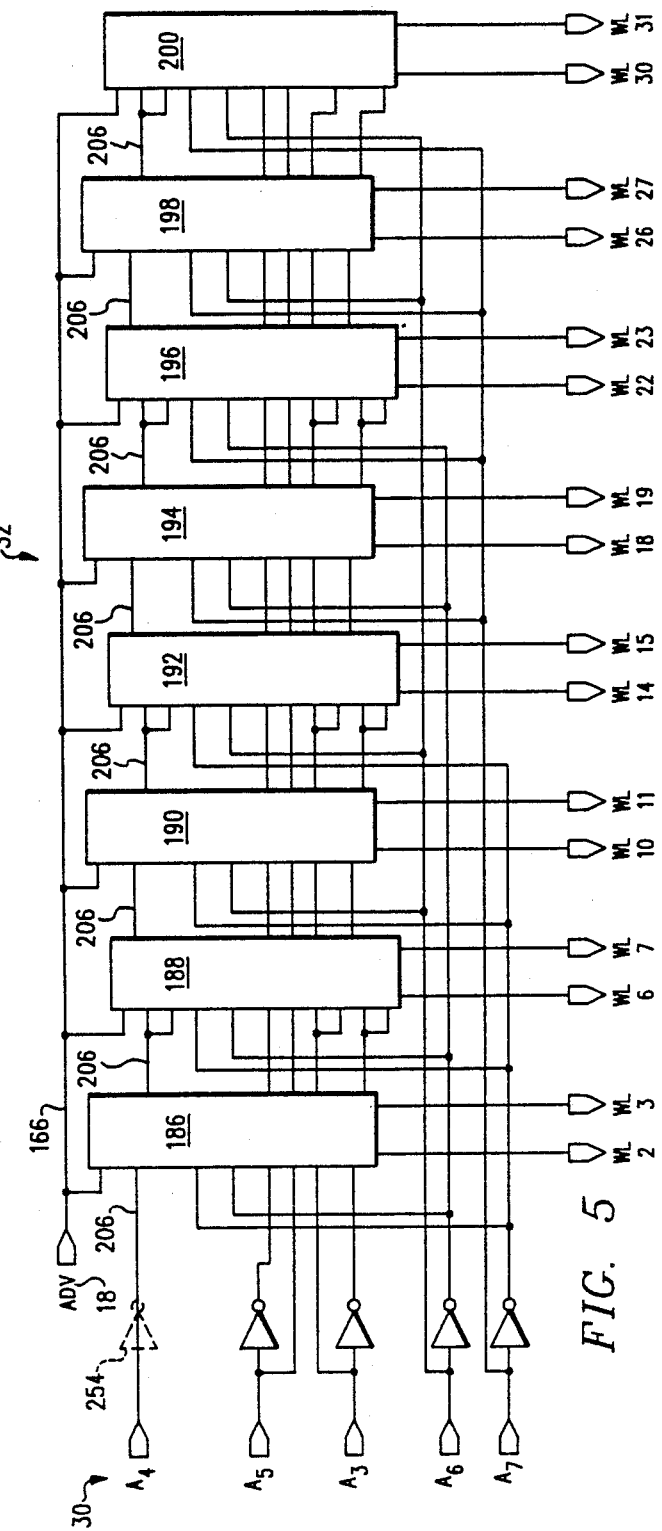
FIG. 5 is a more detailed schematic electrical diagram of the precharge and pull down circuitry shown in FIG. 4.

Turning next to FIG. 5, the circuitry comprising left row decoder 32 is more particularly described. Left row decoder 32 is comprised of a plurality of NAND circuits 186–200. Each NAND circuit 186–200 receives ADV signal 18 via line 166, and further receives an $A_4$ address bit via a line 206. Address bits $A_3$ and $A_5$ and their complements, and selected ones of address bits $A_6$ and $A_7$ or their complements, are fed as inputs into NAND stages 186–200.

Each NAND circuit is operable to decode one of the two word lines. For example, depending on the states of the received address signals $A_3$–$A_7$ or their complements, one NAND circuit of NAND circuits 186–200 will select one word line of word lines 222–252.

The structure of right row address decoder 34 is similar to left row address decoder 32, except that address bit $A_4$ is inverted by an inverter 254 (shown in phantom). The NAND circuits of right row address decoder 34 are each operable to decode one of a pair of word lines 0, 1; 4, 5; etc. Therefore, the presence or absence of inverter 254 in the structure will cause alternate pairs of word lines to be selected. Instead of word lines 2, 3, 6, 7, 10, 11..., the receipt of the complement of address bit $A_4$ will cause one word line of word line pairs 0, 1, 4, 5, 8, 9... to be selected.

Figure 6:
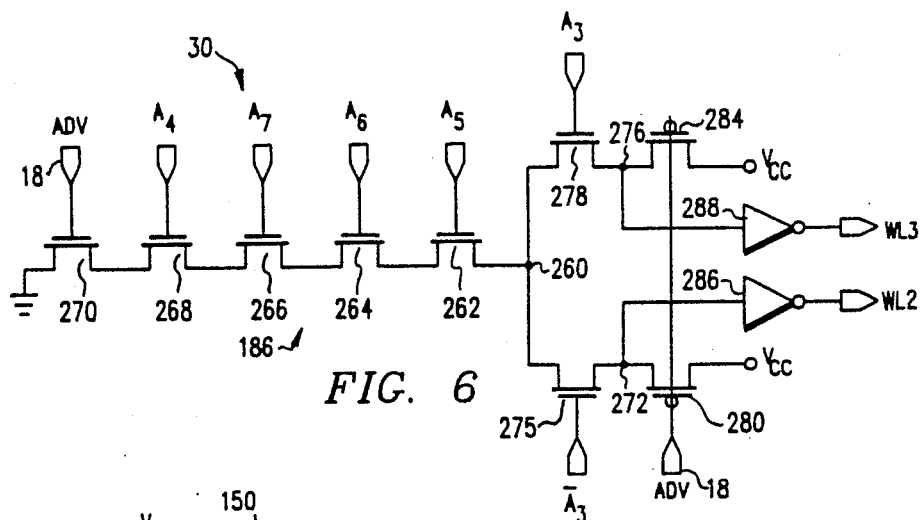
FIG. 6 is an electrical schematic diagram of one NAND circuit among those shown in FIG. 5.

Turning now to FIG. 6, one particular NAND circuit 186 (shown in FIG. 5) is described in more detail. A node 260 is connected via the current path of a plurality of pulldown transistors 262–270 to ground. In a preferred embodiment, all pulldown N-channel transistors shown are N-channel devices and all pullup transistors shown are P-channel devices to avoid $V_t$ losses. The illustrated embodiment employs CMOS technology. The invention could also be embodied in a bipolar technology, in which case the described N-channel devices would have NPN bipolar transistor equivalents, and the described P-channel devices would have PNP bipolar transistor equivalents. Using NMOS technology, a person skilled in the art could design circuits to accomplish the same functions given the embodiment herein described.

Each of transistors 262–270 is actuated by a high state of a respective input. ADV signal 18 actuates transistor 270. Address bit $A_4$ actuates transistor 268. Bit $A_7$ actuates transistor 266. Bit $A_6$ actuates transistor 264. Bit $A_5$ actuates transistor 262.

Node 260 is connected to a node 272 by a transistor 275. Transistor 275 is turned on by a high state of $A_3$. Likewise, a node 274 is connected to node 260 through the current path of an N-channel transistor 278. Transistor 278 is turned on by a high state of true address bit $A_3$. A P-channel transistor 280 connects node 272 to a voltage supply source $V_{CC}$. A low state of ADV signal 18 will keep transistor 280 on. In a like manner, the current path of a P-channel transistor 284 connects a node 276 to voltage source $V_{CC}$. Transistor 284 is also turned on by a low state of ADV signal 18.

Node 272 is connected via an inverter 286 to a word line output WL2. In a similar manner, node 276 is connected via an inverter 288 to a WL3 word line output.

As mentioned above, NAND circuit 186 operates as a selector circuit for both word lines WL2 and WL3. The terms ADV, ($A_4$), ($A_7$), ($A_6$), ($A_5$) and ($A_3$) are ANDed together for a true output, which is inverted at inverter 286 to produce a NAND. Thus, if the product of the above terms is equal to one, node 272 will be pulled low, and this condition will be inverted by inverter 286 to produce a high output on word line WL2. ADV also acts to turn off transistor 280, disconnecting node 272 from $V_{CC}$ and thereby reducing the consumption of static power.

Transistors 270, 268, 266, 264 and 262 are also used to generate an AND product present at node 276, in conjunction with transistor 278. An advantage given by the shown structure is that most of the gate transistors used to decode either of the word line pair are the same, rather than separate transistors being used for each word line. Different transistors 278 and 275 are only needed for the last decoding address bit $A_3$. A further advantage is conferred by the single line of transistors 262–270 in that they can be of a larger horizontal pitch, and therefore have a greater drive capability which drives their outputs faster. ADV signal 18 acts on P-channel transistor 284 to disconnect $V_{CC}$ from node 276 in the same way that transistor 280 disconnects node 272 from $V_{CC}$.

Figure 7:
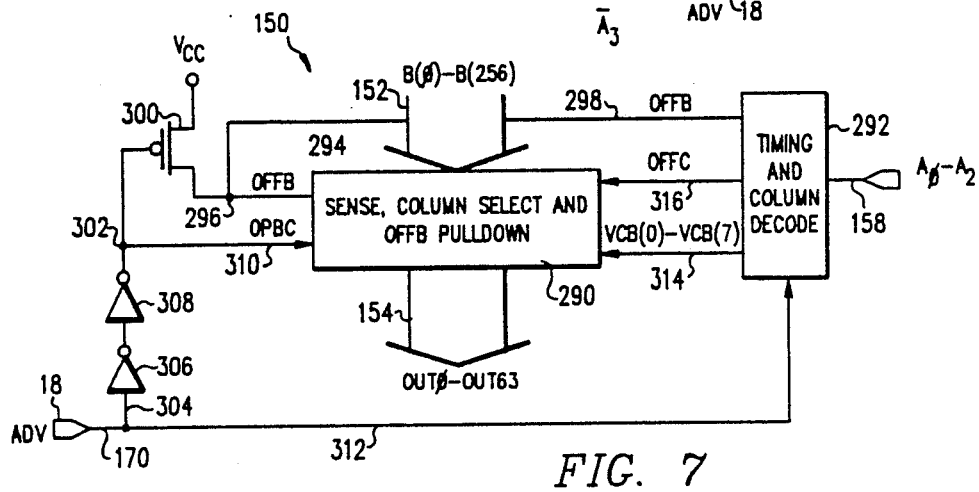
FIG. 7 is a more detailed electrical schematic block diagram of the sense amplifier and timing circuits shown in FIG. 3.

Turning now to FIG. 7, the sense amplifier and timing circuit section 150 shown in FIG. 3 is illustrated by a more detailed block diagram. Section 150 comprises a sense amplifier, column select and OFFB pulldown section 290, and a timing and column decode section 292. As will be explained in more detail below, OFFB is a control signal used in disconnecting the bit lines from the memory outputs after all valid data has been sensed. The OFFB signal is output from section 290 on line 294. Line 294 connects to a node 296, which in turn is connected by a line 298 to timing and column decode section 292. Node 296 is connected to $V_{CC}$ by a P-channel transistor 300. The gate of transistor 300 is connected to a node 302. ADV signal 18 is connected via a line 304 through first and second inverting delay stages 306 and 308 to node 302. As delayed, ADV signal 18 becomes a precharge signal OPCB, which is used to control the gate of transistor 300 and is fed as a separate signal into section 290 using line 310. ADV signal 18 is further fed via a line 312 to timing and column decode section 292. Sense amplifier, column select and pulldown section 290 receives bit line bus 152 as an input, and produces output bus 154 as an output. Section 290 operates to latch the outputs to the sensed data and to select the addressed columns according to column select signals VCB(0)–VCB(7) received on a bus 314. Section 290 will disconnect bit line bus 152 from output bus 154 responsive to an OFFC disconnect signal received on a line 316 from section 292.

Timing and column decode section 292 operates to generate the OFFC signal on line 316 responsive either to a low state of an OFFB signal on line 298, or a received low state on ADV line 312. A low state of binary disconnect signal OFFC on line 316 actuates section 290 to disconnect bit line bus 152 from output bus 154.

Figure 8:
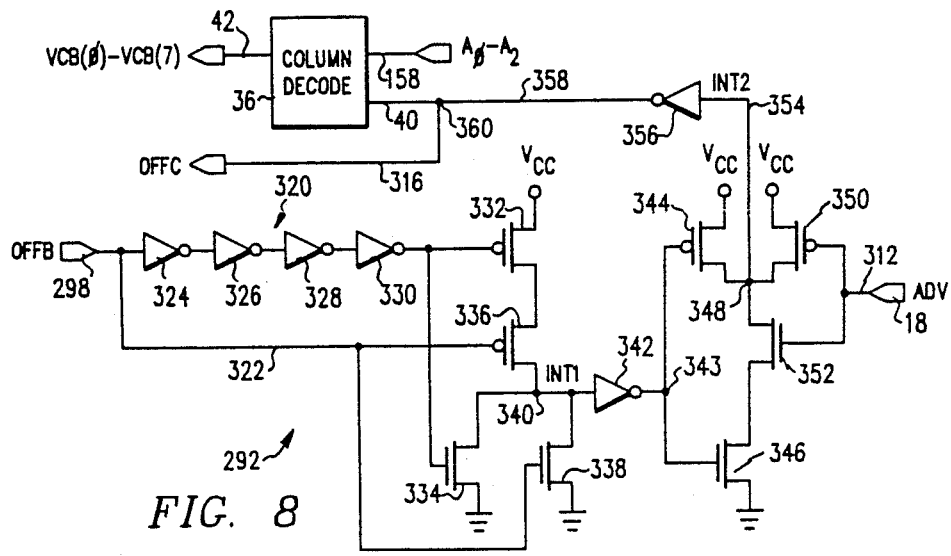
FIG. 8 is a schematic electrical block diagram of the timing and column decoder section shown in FIG. 7.

Turning now to FIG. 8, a schematic electrical diagram of timing and column decoder section 292 is shown. Control signal OFFB is input on line 298 to a delay circuit indicated generally at 320 and to a non-delayed line 322. Delay circuit 320 comprises in the shown embodiment four inverter stages 324–330. The delayed OFFB control signal is applied to the gates of a P-channel transistor 332 and an N-channel transistor 334. The undelayed OFFB signal is applied to the gates of a P-channel transistor 336 and an N-channel transistor 338. When OFFB is in a low state, and this low state has existed for the delay period defined by inverters 324–330, a node 340 will be connected to $V_{CC}$ through P-channel transistors 332 and 336. At the same time, node 340 will be disconnected from ground since both transistors 334 and 338 will be off. While node 340 will experience a delay in rising to $V_{CC}$, there will be only a small delay experienced in switching node 340 to ground, as the undelayed OFFB signal in a high state on line 322 will immediately disconnect $V_{CC}$ from node 340 by turning off transistor 336, and at the same time will turn on transistor 338 to connect node 340 to ground.

Other circuitry for implementing a delay may be provided in the place of the circuitry shown in FIG. 8, such as circuitry using an RC time constant delay. Further, alternate array architectures may be provided such that all addressed bits are received by the sense amplifiers 46 at a more uniform time. Were this the case, no intentional delay circuitry would be needed, as there would be no need to wait for a long period while all valid data bits are sensed. The delay inherent in the remaining disconnect circuitry, such as line 322, transistors 336 and 338, inverter 342, etc., would be sufficient.

Thus, after a predetermined delay, control signal OFFB will produce an intermediate control signal INT1 in a high state at node 340. INT1 is inverted at inverter 342 and is applied to the gates of a P-channel transistor 344 and an N-channel transistor 346. In a low state, the inverted INT1 signal actuates P-channel transistor 344 to connect a node 348 to $V_{CC}$. The same inverted INT1 signal will disconnect node 348 from ground since N-channel transistor 346 will be turned off.

The ADV signal is input into the circuit on line 312, where it is applied to the gate of a P-channel transistor 350 and the gate of an N-channel transistor 352. A low state of ADV will connect node 348 to $V_{CC}$ and will disconnect node 348 from ground by turning off transistor 352. Where both an inverted INT1 signal and ADV are high, node 348 will be disconnected from $V_{CC}$ and will be connected to ground. A second intermediate signal INT2 appears at node 348 responsive to a low state of either inverted INT1, or ADV. INT2 is input via a line 354 to an inverter 356. Inverter 356 produces disconnect signal OFFC on a line 358. Line 358 connects inverter 356 to a node 360. Node 360 is connected via line 40 to column decode section 36, and the OFFC signal is output from section 292 on line 316.

Column decode section 36 operates to pull up a selected column select control signal VCB(n) from one of eight said signals VCB(0)–VCB(7) responsive to the states of address bits $A_0$–$A_2$ input on bus 158. Block 36 will pull down all column select lines VCB(0)–VCB(7) to a low state responsive to a low OFFC signal input on line 40.

Preferably, section 292 is built with CMOS technology, in which case transistors 332, 334; 336, 338; 344, 346; and 350, 352 are CMOS pairs.

Figure 9:
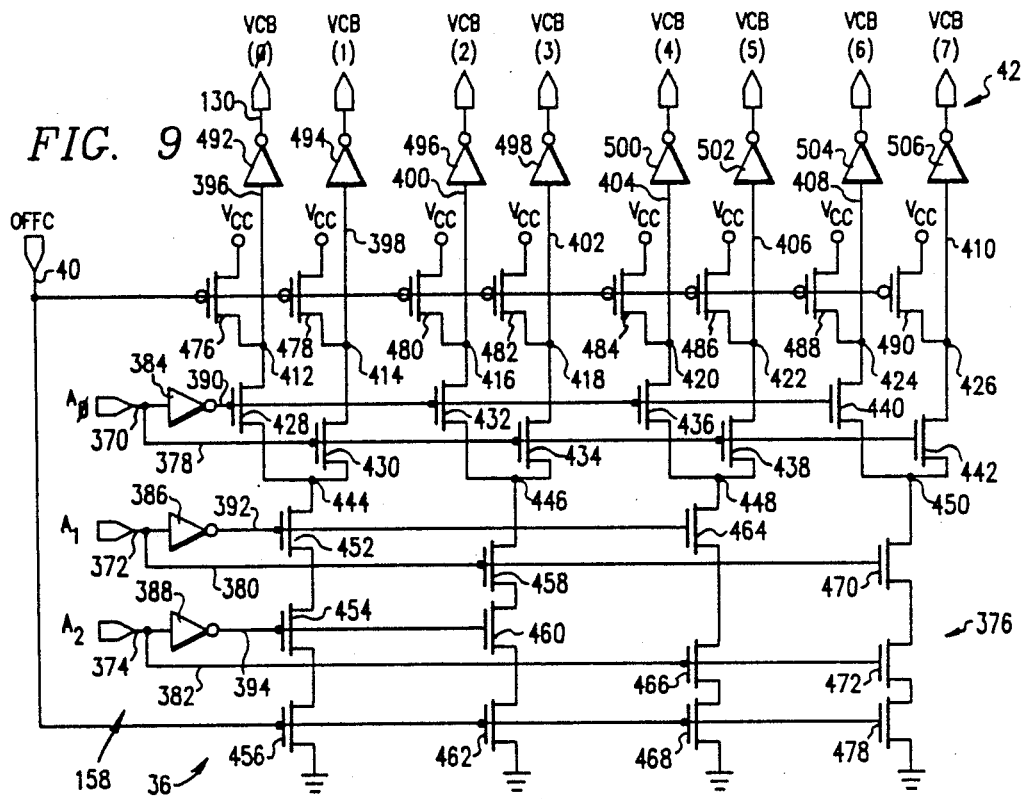
FIG. 9 is a schematic electrical diagram of a column decoder section shown in FIG. 8.

Referring now to FIG. 9, the column decoder section 36 as shown in FIG. 8 is shown in more detail. Address bits $A_0$–$A_2$ are input on lines 370–374, respectively. The true address bits are input into a decoding matrix 376 on lines 378–382. The address bits $A_0$–$A_2$ are inverted at inverters 384–388, and their complements are input into matrix 376 on lines 390–394, respectively. Decoder 36 is further provided with eight internal column select lines 396–410. Internal column select lines 386–410 and address input lines 378–394 intersect to form matrix 376. Transistors 428–472 are formed at selected intersections of lines 396-410 with lines 378-394, as will be described below. Each transistor 428-472 has a gate controlled by a selected address bit input line 378-394, and the current path of each of transistors 428-472 is formed as a portion of a respective internal column select line 396-410. Each internal column select line 396-410 is connected to a respective node 412-426. Internal column select lines 396-410 are arranged in pairs. Address bit $A_0$ selects between each pair with transistors 428-442. The current paths of transistors 428 and 430 are connected to a common node 444. In a similar manner, the current paths of transistor pairs 432-434, 436-438, and 440-442 are connected to respective common nodes 446-450. Three transistors 452-456 have current paths that are connected in series between node 444 and ground. Transistor 452 is actuated by the complement of bit $A_1$ and transistor 454 is actuated by the complement of bit $A_2$. Transistor 456 is actuated by a high OFFC signal. In a like manner, N-channel transistors 458-462 have current paths that are connected in series to connect node 446 to ground; transistors 464-468 have current paths that connect node 448 to ground; and transistors 470-474 have current paths that connect node 450 to ground. Transistors 458, 460, 464, 466, 470 and 472 are actuated by a high state of $A_1$, $A_2$, or a complement of one of these two address bits. Transistors 462, 468 and 470 are actuated by a high OFFC signal.

The decoding matrix shown presents a technical advantage over more conventional designs in that it shares decoding transistors for each pair of internal column select lines for two out of three address bits. The AND of a high state of OFFC and selective combinations of $A_0$-$A_2$ and their complements will pull a selective column select line 396-410 to ground. A low state of disconnect signal OFFC will allow P-channel transistors 476-490 to conduct, coupling internal column select lines 396-410 to $V_{CC}$. The state present on internal column select lines 396-410 is inverted by inverters 492-506, and these inverted states are output on external column select lines 42. Therefore, a low state of OFFC will cause low states on all column select lines 42, while a high state of OFFC will cause a selected one of the column select lines 42 to be pulled up to a high state.

Figure 10:
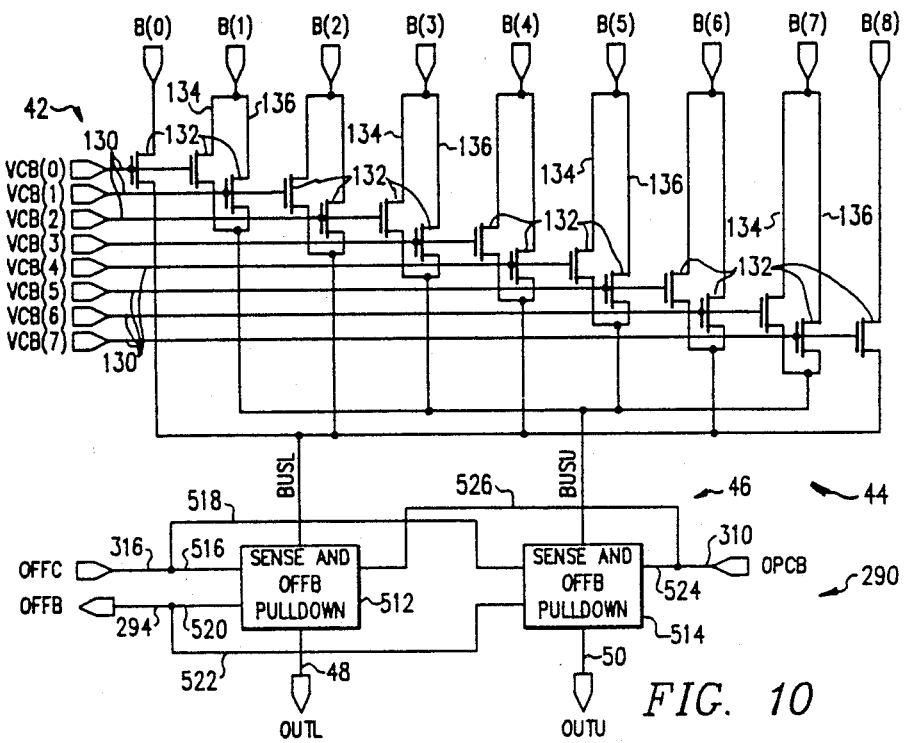
FIG. 10 is a more detailed schematic electrical block diagram of the sense, column select and OFFB pull down section shown in FIG. 7.

The sense, column select and OFFB pulldown section 290 schematically shown in FIG. 7 is shown in more detail in FIG. 10. FIG. 10 shows one of 32 identical circuit sections, each corresponding to bit line select and sense amplifier sections 44 and 46 of FIG. 1. Bit select lines VCB(0)-VCB(7), corresponding to lines 130 shown in FIG. 1, are input into a column select matrix 44. Bit lines B(0)-B(8) are input into the matrix in a direction preferably perpendicular to column select lines VCB(0)-(VCB(7). Bit lines B(1)-B(7) are each split into bit lines 134 and 136 for decoding purposes. Transistors 132 are formed at selected locations of the intersections of bit line branches 134 and 136 with column select lines VCB(0)-VCB(7). The first bit line B(0) and the last bit line B(8) are not branched within the array section; in all but the first and last array section 14 (FIG. 1), these bit lines are shared with adjacent array sections.

Bit lines B(0), B(2), ...B(8) are connected in common to a lower-order bus BUSL. Likewise, bit lines B(1). B(3),... B(7)... are connected in common to an upper-order bus BUSU. In operation, one of column select lines VCB(0)-VCB(7) will be high, while the rest will be low, unless disconnect signal OFFC (FIG. 9) has pulled all of the column select lines low. Therefore, only two adjacent bit lines will be selected, one of which will be connected to BUSL and the other connected to BUSU.

A lower-order-bit sense amplifier and OFFB pulldown circuit 512 receives line BUSL, and a similar, upper-order-bit sense amplifier and OFFB pull down circuit 514 receives line BUSU. Disconnect signal OFFC is input into sections 512 and 514 via lines 516 and 518, respectively. A control signal line OFFB 294 is connected via a line 520 to sense amplifier and pulldown section 512, and via a line 522 to sense amplifier and OFFB pulldown section 514. A precharge signal OPCB is input via line 310 and lines 524 and 526 to sense amplifier and pulldown sections 514 and 512, respectively.

The column select matrix 44 provides a technical advantage in that the sense circuitry in sections 512 and 514 is isolated from noise signals on the bit lines of a magnitude less than the threshold voltage of transistors 132.

A further technical advantage is provided by the column select and disconnect circuitry shown in FIGS. 9 and 10 in that a disconnect-initiating signal OFFC is used to disable the decoding of bit line connect signal VCB(n). With reference to FIG. 9, a low state of OFFC allows the connection of nodes 412-426 to $V_{CC}$ through transistors 476-490. At the same time, a low state of OFFC will deactivate transistors 456, 462, 468 and 478. In this way, the decoding of a selected bit line connect signal VCB(n) responsive to address signals $A_0$-$A_2$ is disabled.

Alternative methods of disconnecting the bit lines from the output buses are not as desirable. For example, and continuing to refer to FIGS. 9 and 10, the disconnect-initiating signal OFFC could be used to deactivate a plurality of P-channel transistors inserted in the respective bit lines in series between transistors 132 and either BUSL or BUSU. This scheme would have the disadvantage of having to be repeated 32 times, once for each bit line select section 44. Another scheme would be to replace inverters 492-506 (FIG. 9) with corresponding NAND gates. In this alternative scheme, the complement of the address valid signal would be used to operate transistors 476-490 and transistors 456, 462, 468 and 478. The OFFC equivalent signal, which has to be generated in any event, would be fed as an input to each of the NAND gates with the illustrated lines 396-410 representing the other input. This scheme is inferior to that illustrated because the NAND gates would have to occupy an area approximately eight times the size of the more simple inverters 492-506 in order to obtain the same driving capability. Hence, the use of a disconnect-initiating signal such as OFFC to disable the dynamic NAND function of the circuitry shown as FIG. 9 is advantageous in that it saves area and obviates the need to use many more transistors.

Figure 11:
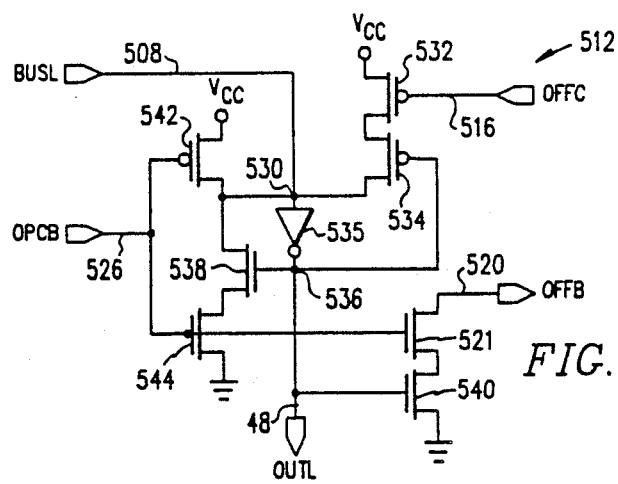
FIG. 11 is a more detailed schematic electrical diagram of a lower-bit sense amplifier and OFFB pull down circuit as shown in FIG. 10.

Sense amplifier and OFFB pulldown section 512 is illustrated in more detail by the circuit diagram of FIG. 11. Section 514 is similar in construction. In FIG. 11, the BUSL signal, representing the sensed bit from the selected lower-order bit line, is input via line 508 to a node 530. Disconnect signal OFFC is input on line 516 to the gate of a P-channel transistor 532. Transistor 532 and a further P-channel transistor 534 normally connect node 530 to voltage supply $V_{CC}$. The complement of the signal at node 530 will appear as an output of an inverter 535 at a node 536. The signal present at node 536 in turn controls the gate of transistor 534 as well as the gate of an N-channel transistor 538. The signal node 536 further appears as the sensed bit line value appearing on lower-order-bit output bus OUTL (48). The signal at node 536 is also used to control the gate of an N-channel transistor 540.

Precharge signal OPCB is input on line 526 and is used to control the gates of a P-channel transistor 542 and an N-channel transistor 544. When the precharge signal OPCB is low, node 530 will be pulled high to $V_{CC}$ and will be isolated from ground. Therefore, node 536 will be low.

The sense amplifier circuit 512 shown presents a technical advantage in that it speeds the latching of the output as follows. BUSL line 508 is initially precharged high. When BUSL is pulled low due to the presence of a transistor at the selected cell location, the voltage at node 530 will tend to come down slowly. When the voltage at node 530 goes below the logic transition of inverter 535, the inverter switches, producing a high signal at node 536. This in turn turns on transistor 538. If transistor 455 has been activated by a high state of precharge signal OPCB, node 530 will be pulled the rest of the way to ground. This conserves static power dissipation from inverter 353.

A low signal at node 530 will pull the OFFB signal line 520 low as follows. A low voltage at node 530 is translated into a high voltage at node 536. This in turn turns on transistor 540. If precharge signal OPCB is high, then OFFB will be pulled low through line 520. The low state of OFFB is communicated back to the timing and decoding circuitry shown in FIG. 8, where it is in turn used to generate a low state of disconnect signal OFFC after a predetermined delay, which is then transmitted to all sense amplifiers.

Assume now that sense amplifier 512 did not generate OFFB but instead received a high state on BUSL. A low state of OFFC will turn on P-channel transistor 532. If a high value appears at node 530, this will be reflected as a low value at node 536. A low value at node 536 in turn actuates transistor 534, latching node 530 into a high condition, and therefore latching node 536 into a low condition. The latching action of OFFC occurs throughout all 64 sense amplifier sections 512 and 514 (FIG. 10) that receive a high state. The latching is to hold the state of BUSL high when disconnected from the bit line, thereby preventing the loss of the proper output.

If noise lowers the voltage of node 530 below the threshold of the P-channel transistor (not shown) in inverter 535, but above the logic threshold of inverter 535, static power is dissipated. This will be shut off by the latching action of OFFC.

Figure 12A:
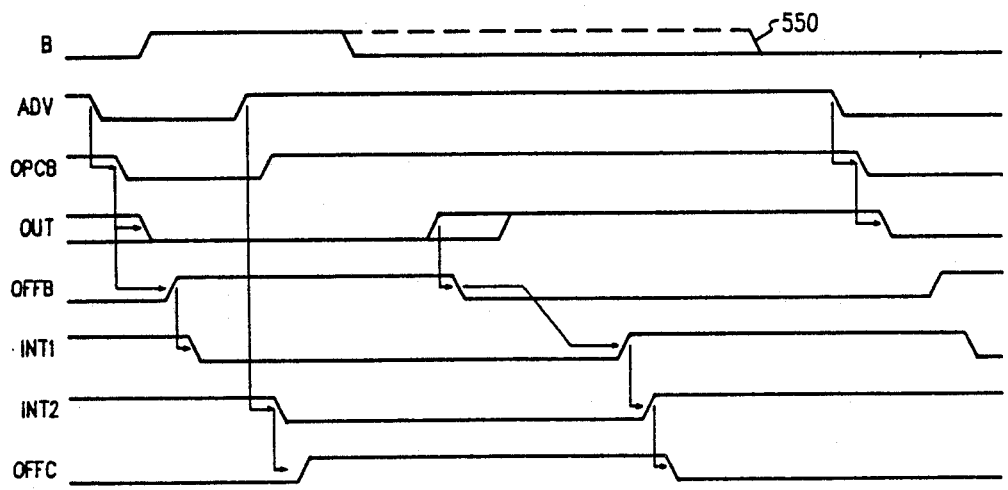
FIGS. 12a and 12b are timing sequences for the read-only memory illustrated in FIGS. 1–11 for fast clock and slow clock conditions, respectively.
Figure 12B:
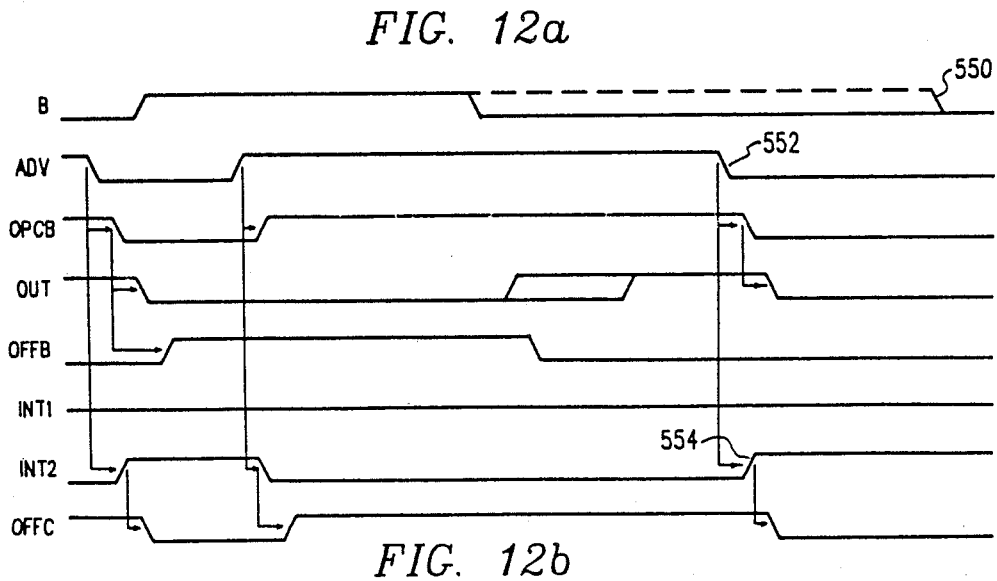

FIG. 12a is a timing diagram for the memory array as operating under a 64 nanosecond clock, while FIG. 12b is a timing diagram for operation under a 25 nanosecond clock.

In both sequences, a precharge portion of the cycle occurs first. In FIG. 12a, the timing chain is initiated by the ADV signal going low. Referring momentarily to FIG. 7, precharge signal OPCB goes low after two inverter delays. A similar precharge signal, PCB, also goes low after two inverter delays, as shown in FIG. 4. Through circuitry not shown, precharge signal PCB (FIG. 1) precharges all of the bit lines and virtual ground lines (FIG. 2) in the array. This is represented in FIG. 12a by bit line signal B going high.

Responsive to precharge signal OPCB going low, transistor 542 in each sense amplifier (FIG. 11), will be rendered conductive, pulling node 530 high. This in turn sends node 536 and output line 48 low. Node 536 in a low condition in turn renders transistor 538 non-conductive, isolating node 530 from ground. A low OPCB signal will also turn off transistor 521, isolating OFFB from ground. Referring back to FIG. 7, a low state of OPCB at node 302 will keep transistor 300 on thus, precharging the OFFB control signal line to a high state.

Next, the high state of OFFB signal will turn on N-channel transistor 338 (FIG. 8) forcing intermediate signal INT1 low. INT1 is inverted by inverter 342, and therefore, a high state will exist at node 343. This will turn transistor 344 off and turn transistor 346 on.

Next, the ADV signal is changed back to a high state to begin the sensing operation. A high ADV state, when taken in conjunction with received address bits $A_3-A_7$, will enable the left and right row decoders to select one of the word or row lines. In FIG. 6, a certain combination of address bit values as applied to one of the NAND circuits 186–200 (FIG. 5) and, taken in conjunction with a high ADV signal, will disconnect either node 272 or node 276 from $V_{CC}$ and will pull the affected node low. This low condition is inverted by either inverter 286 or inverter 288 and output on the selected word line.

Referring next to FIG. 4 in conjunction with FIG. 12a, a selected column in each array section 14 (FIG. 1) will be addressed responsive to a high ADV signal and a received three-bit address $A_0-A_2$. The selection is made with dynamic NAND circuitry in a manner similar to the row decoding. One of eight virtual ground select lines 178 is pulled high, and this in turn will pull one selected virtual ground line low in each of the thirty-two sections 14 (FIG. 1).

The action of ADV and bits $A_0-A_7$ has at this point addressed two selected cells in each array section 14. Depending on the presence or absence of a transistor 100 in a respective cell (FIG. 2), a bit line B(n) will be pulled low responsive to an adjacent virtual ground line being pulled low, as shown in FIG. 12a. Raising ADV also raises signal OPCB after two inverted delays. As shown in FIG. 11, the raising of OPCB to a high value disconnects node 530 from $V_{CC}$ as accessed through P-channel transistor 542. Referring next to FIG. 8, raising ADV to a high state will disconnect node 348 from the $V_{CC}$ source accessed through P-channel transistor 350, and will further turn on transistor 352. Since transistor 346 is already turned on at this point, intermediate signal INT2 will be pulled low. This is translated through inverter 356 to a high OFFC state (FIG. 12a).

Referring now to FIG. 9, a high OFFC state has the effect of disconnecting internal column select lines 396–410 from respective voltage supplies through P-channel transistors 476–490. A high OFFC state, in conjunction with the particular address $A_0-A_2$, will select one of eight column select lines VCB(i). One of lines 396–410 will be pulled low, and the inverse of this low state will show up on the selected column select line 42.

Referring to FIG. 10, the energized column select line VCB(i) will connect a respective lower bit line to a lower bit sense amplifier and OFFB pulldown circuit 512, and to a respective upper bit sense amplifier and OFFB pulldown section 514. Thus, the condition of the selected bit line for each array section is communicated to a respective sense amplifier, while the nonselected virtual ground lines and bit lines are allowed to float.

If any addressed cell location has a transistor formed therein, the bit line adjacent it will be pulled low. Therefore, line 508 (FIG. 11) will be pulled low in at least one of the respective sense amplifier sections if a transistor is formed in any addressed cell. If in the rare event that no transistors are present in the addressed cells, no sneak path would be possible and a disconnection of the bit lines from the outputs would not be necessary.

Assuming the existence of at least one addressed transistor, node 530 will be low, and therefore node 536 will be high. Since OPCB is at this point high, this condition will be latched once the threshold of inverter 535 has been reached. Since both node 536 and OPCB are high, control signal OFFB is pulled low to ground through transistors 521 and 540. In effect, control signal OFFB is pulled low as a result of a NOR of all of the output lines.

As pulled low, the OFFB signal is transmitted via line 298 (FIG. 7) from sense amplifier, column select and OFFB pulldown section 290 to timing and column decode section 292 (FIG. 6). There, it is input into a series of inverter stages 324–330 in order to delay the signal in branch 320 (FIG. 8). Certain of these inverter stages have gate lengths that are made longer than necessary in order to further delay the signal. At the same time, the OFFB signal is fed into a non-delayed branch 322. The low state on line 322 will turn on transistor 336 immediately and will turn off pulldown transistor 338. After a delay of a predetermined number of nanoseconds, the delayed OFFB signal will appear at the gate of transistors 332 and 334, turning on transistor 332 and turning off transistor 334. This connects node 340 to $V_{CC}$. Intermediate signal INT1 will therefore be high. INT1 is inverted by inverter 342, and a low state will therefore exist at node 343. Transistor 344 is turned on, while transistor 346 is turned off. Node 348 is therefore brought high, as is shown on the INT2 timing plot in FIG. 12a.

After one inverter delay at 356, a low OFFC signal is produced on line 316. Referring to FIG. 9, a low OFFC signal on line 40 will connect lines 396–410 to $V_{CC}$ and will disconnect nodes 444–450 from ground. A high state on lines 396–410 will result which translates into a low state on lines 130. Referring next to FIG. 10, a low state on lines 132 will disconnect all of the bit lines from the sense amplifier buses 508 and 510.

Referring to FIG. 11, a low state of OFFC has the effect of turning transistor 532 on. Where node 530 is high, the low state of OFFC will have the effect of latching it to this condition.

As shown in FIG. 12a, the bit lines have effectively been disconnected from the output buses at a time much before a point 550, where the fastest sneak path will pull down a bit line that was previously in a high state. Therefore, the transmission of false data to the output buses is prevented.

Referring now to FIG. 12b, a timing diagram is shown for the invention as operating under a relatively fast (25 nanosecond) clock. FIGS. 12a and 12b are not to the same time scale, with a segment in FIG. 12b representing a shorter period of time than a segment of like length in FIG. 12a. Under the fast clock sequence, ADV is used to pull OFFC high after much less delay than the sequence shown in FIG. 12a. Referring to FIG. 8, the switching of the ADV signal to a high state will disconnect node 348 from $V_{CC}$ and turn transistor 352 on. As shown in FIG. 12b, the intermediate signal INT1 never leaves a low state. This translates through inverter 342 to a high state at node 343. Therefore, transistor 344 is turned off, and transistor 346 is turned on. Node 348 is therefore connected to ground, and INT2 will correspondingly be set in a low state. The low state of INT2 is translated through invertor 356 to a high sate on OFFC output line 316.

At time 552, the ADV signal is pulled low. This returns the INT2 signal to high at 554. The INT1 signal does not have a chance to change states in the interim period, as the delay from the generation of the OFFB signal is insufficient before ADV is pulled low. Therefore, the OFFC signal on line 316 (FIG. 8), is pulled low in only a two-step timing sequence based on ADV rather than on OFFB.

Thus, a technical advantage is presented in that a low state on OFFC line 316 can be generated either responsive to a delayed OFFB signal under a slow clock, as shown in FIG. 12a, or can be generated more directly from a low state of the ADV signal under a high frequency clock. The memory array of the invention is therefore adaptable to clocking sequences ranging from at least as fast as 25 nanoseconds to very slow.

In summary, a low-power, noise-resistant, read-only memory array has been disclosed that is suitable for on-chip fabrication together with other electronic circuitry, and in particular is capable of being situated underneath a relatively noisy data path. The array of the invention avoids the dissipation of static power by eliminating active pullups from the virtual ground and bit lines. Instead, all of the lines are charged up and allowed to float, and a selective virtual ground line in each of a plurality of sections is pulled low. To avoid the false data readout due to a sneak path, novel disconnect circuitry has been provided that is actuated by a NOR of each of the output lines. Under a fast clock, the disconnect can also be actuated by the changing of states of an "address valid" signal.

While preferred embodiments of the invention and the advantages thereof have been described above, the invention is not limited thereto but only by the spirit and scope of the appended claims.

What is claimed is:

1. A memory including a plurality of rows and columns of memory cells, each row of memory being associated with a row address comprising a plurality of address bits, each row being capable of receiving a control signal through a word line, comprising:
   a row decoder for decoding an address of one of said rows, said row decoder comprising a plurality of NAND circuits, each NAND circuit being capable of receiving input from signals including a selected set of signals corresponding to a selected set consisting of address bits, complements of address bits or a combination thereof, each NAND circuit being further capable of outputting a plurality of signals received by selected word lines;
   each NAND circuit comprising a plurality of first transistors having current paths coupled in series between a voltage reference and a node, respective gates of said first transistors capable of receiving input from signals including a selected set of signals corresponding to a selected set consisting of address bits, complements of address bits or a combination thereof;
   a second transistor capable of having a current path for coupling said node to a selected signal output from a selected NAND circuit; and a third transistor having a current path for coupling said node to a signal selected from a set of signals corresponding to a selected set consisting of address bits, complements of address bits, or a combination thereof.

2. The decoder of claim 1, wherein said NAND circuit is capable of receiving an enabling signal, and wherein the decoder further comprises a transistor responsive to said enabling signal, said transistor being operable such that said transistor is coupled in series with selected first transistors between said node and said voltage reference.

* * * * *